(12) United States Patent
Hatori et al.

(10) Patent No.: US 9,490,233 B2
(45) Date of Patent: Nov. 8, 2016

(54) FINGERPRINT RECOGNITION SEMICONDUCTOR DEVICE AND SEMICONDUCTOR DEVICE

(71) Applicant: Shinko Electric Industries Co., Ltd., Nagano-ken (JP)

(72) Inventors: Yukinori Hatori, Nagano (JP); Takashi Ozawa, Nagano (JP); Kazuya Kojima, Nagano (JP); Futoshi Tsukada, Nagano (JP)

(73) Assignee: Shinko Electric Industries Co., LTD., Nagano-ken (JP)

( * ) Notice: Subject to any disclaimer, the term of this patent is extended or adjusted under 35 U.S.C. 154(b) by 0 days.

(21) Appl. No.: 14/869,115

(22) Filed: Sep. 29, 2015

(65) Prior Publication Data

US 2016/0099232 A1    Apr. 7, 2016

(30) Foreign Application Priority Data

Oct. 7, 2014    (JP) .................... 2014-206529

(51) Int. Cl.
*H01L 25/065*    (2006.01)
*G06K 9/00*    (2006.01)

(52) U.S. Cl.
CPC .......... *H01L 25/0657* (2013.01); *G06K 9/0002* (2013.01); *G06K 9/00006* (2013.01); *G06K 9/00053* (2013.01); *H01L 2224/16225* (2013.01)

(58) Field of Classification Search
CPC ............. G06K 19/07701; G06K 9/0002; H01L 23/3114; H01L 21/78; H01L 21/56; H01L 23/528; H01L 23/562; H01L 21/768; H01L 21/31
See application file for complete search history.

(56) References Cited

U.S. PATENT DOCUMENTS 6,825,551 B1 * 11/2004 Do Bento
 Vieira ................ H01L 23/3107
 257/666
8,717,775 B1    5/2014 Bolognia et al.

FOREIGN PATENT DOCUMENTS

JP    2003282609 A    10/2003
JP    2004-304054 A    10/2004

OTHER PUBLICATIONS

European Search Report dated Jun. 16, 2016 in connection with European Application No. EP 15187920, 7 pages.

* cited by examiner

*Primary Examiner* — Roy Potter
(74) *Attorney, Agent, or Firm* — Wolf, Greenfield & Sacks, P.C.

(57) ABSTRACT

A fingerprint recognition semiconductor device includes an insulation layer, a wiring pattern formed on a lower surface of the insulation layer, and a sensor element flip-chip-connected to the wiring pattern. The sensor element includes an active surface, including a sensor portion that recognizes a fingerprint, and a rear surface, located at a side opposite to the active surface. An encapsulation resin fills a gap between the lower surface of the insulation layer and an upper surface of a wiring substrate, facing the rear surface of the sensor element and connected to the wiring pattern by a connecting member. The entire active surface of the sensor element is covered by underfill formed between the active surface of the sensor element and the lower surface of the insulation layer. The insulation layer includes an upper surface, defining an uppermost surface and free from a wiring layer.

11 Claims, 12 Drawing Sheets

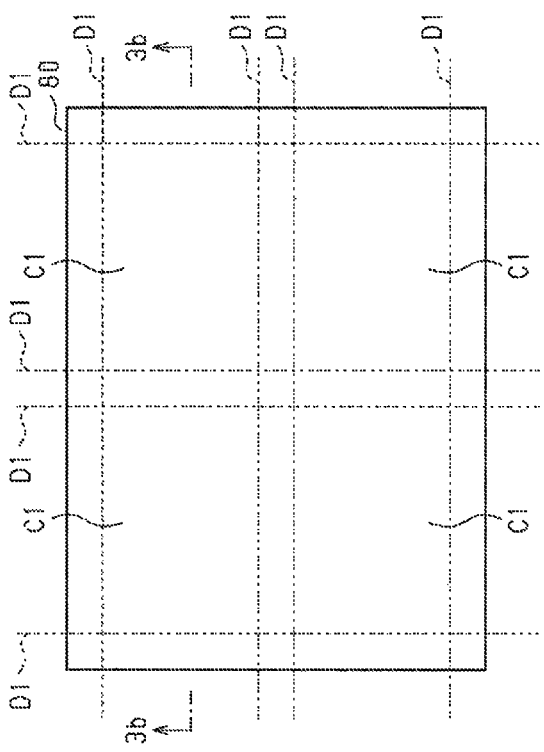
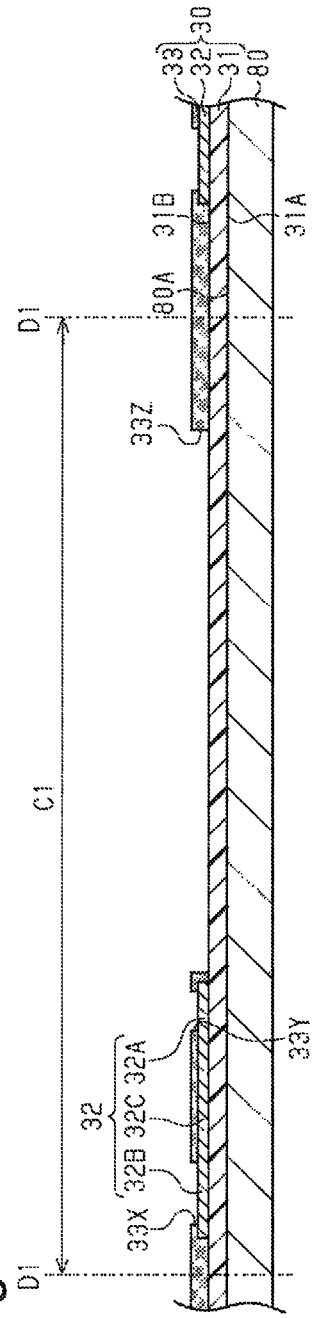
Fig.3A
Fig.3B

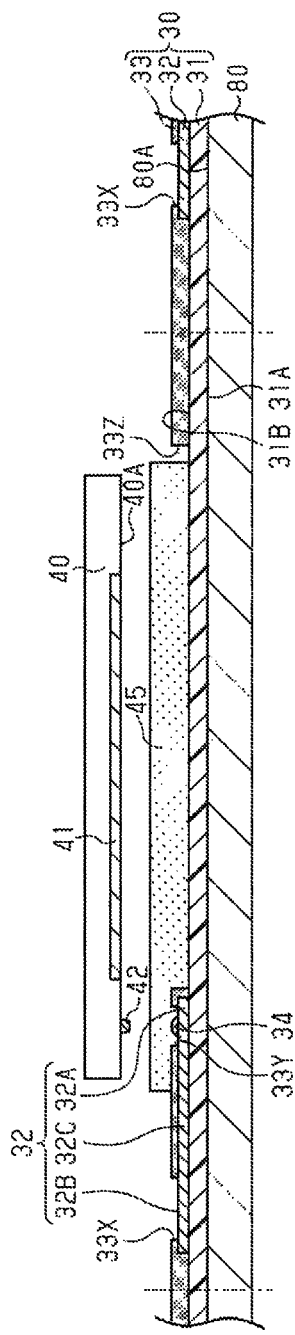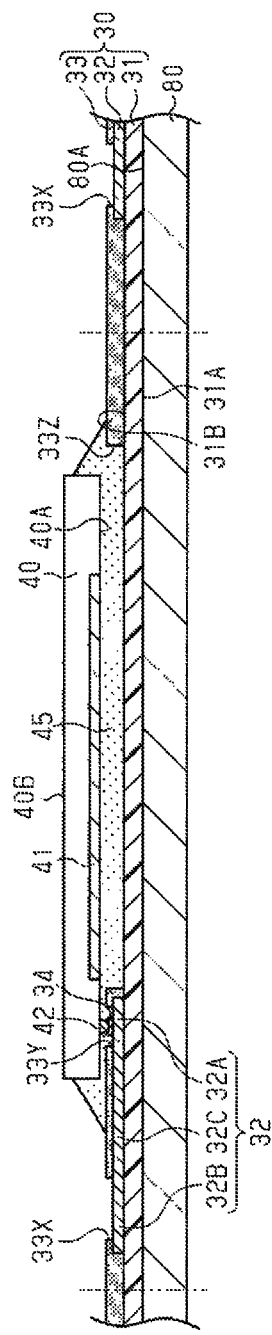

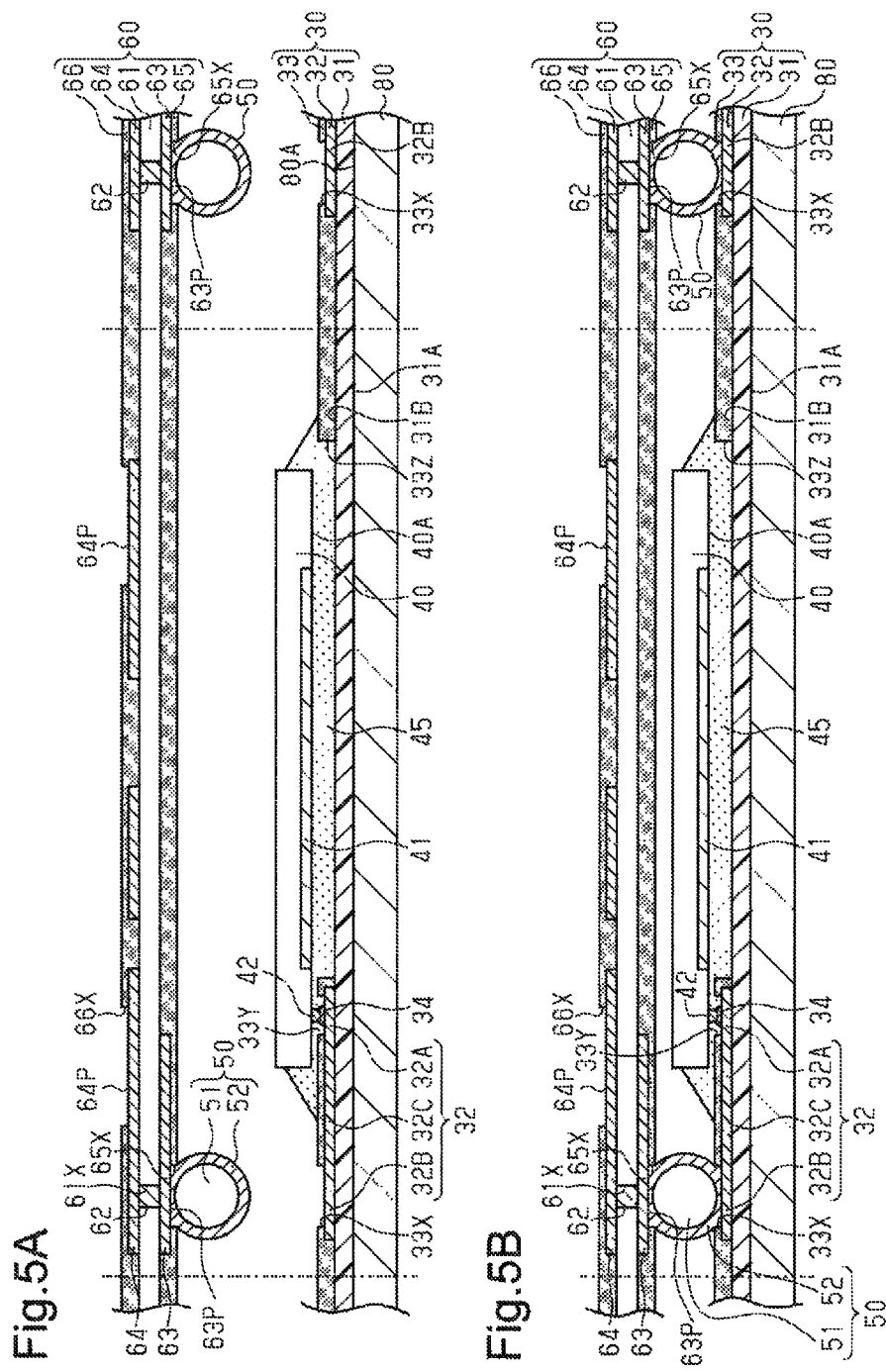

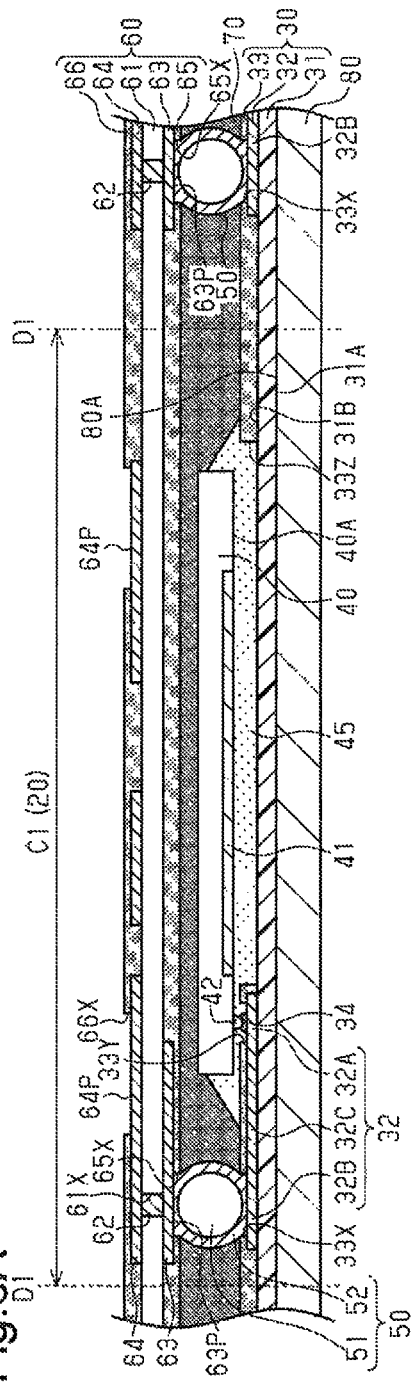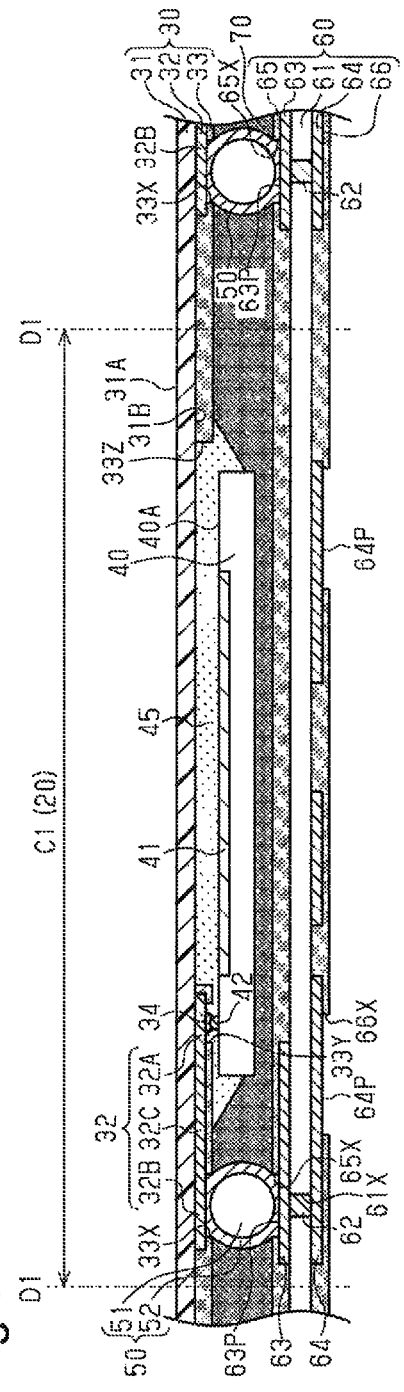

FINGERPRINT RECOGNITION SEMICONDUCTOR DEVICE AND SEMICONDUCTOR DEVICE

CROSS-REFERENCE TO RELATED APPLICATION

This application is based upon and claims the benefit of priority from prior Japanese Patent Application No. 2014-206529, filed on Oct. 7, 2014, the entire contents of which are incorporated herein by reference.

BACKGROUND OF THE INVENTION

This disclosure relates to a fingerprint recognition semiconductor device, a method for manufacturing a fingerprint recognition semiconductor device, and a semiconductor device.

Japanese Laid-Open Patent Publication No. 2004-304054 describes a fingerprint recognition semiconductor device (fingerprint sensor) that is used for verifying a fingerprint. The fingerprint sensor includes a sensor element. When a user places his or her finger on a fingerprint detection region of the sensor element, the fingerprint sensor reads the fingerprint of the user.

Two examples of conventional fingerprint sensors will now be described. In the first example of a conventional fingerprint sensor, an opening is provided for an encapsulation resin, which encapsulates a sensor element. The fingerprint detection region of the sensor element is exposed to the exterior in the opening. In the second example of a conventional fingerprint sensor, a sensor element is coupled to a substrate by wire bonding, and an encapsulation resin is formed on the substrate to encapsulate the sensor element and bonding wires.

In the first example of the conventional fingerprint sensor, the fingerprint detection region of the sensor element is not protected by the encapsulation resin or the like. Thus, the fingerprint detection region easily receives physical and electrical impacts. In contrast, in the second example of the conventional fingerprint sensor, the fingerprint detection region of the sensor element is protected by the encapsulation resin. However, the encapsulation resin is set to be thick enough to sufficiently cover the bonding wires. Thus, a thick encapsulation resin exists on the fingerprint detection region. This decreases the detection sensitivity of the fingerprint sensor.

SUMMARY OF THE INVENTION

One aspect of this disclosure is a fingerprint recognition semiconductor device. The fingerprint recognition semiconductor device includes an insulation layer including an upper surface and a lower surface that is located at a side opposite to the upper surface. A wiring pattern is formed on the lower surface of the insulation layer. A sensor element is flip-chip-connected to the wiring pattern. The sensor element includes an active surface, arranged to face the lower surface of the insulation layer and including a sensor portion that recognizes a fingerprint, and a rear surface, located at a side opposite to the active surface. An underfill is formed between the active surface of the sensor element and the lower surface of the insulation layer. A wiring substrate is arranged to face the rear surface of the sensor element and connected to the wiring pattern by a connecting member. An encapsulation resin fills a gap between the lower surface of the insulation layer and an upper surface of the wiring substrate and a gap between the rear surface of the sensor element and the upper surface of the wiring substrate. The active surface of the sensor element is entirely covered by the underfill. The upper surface of the insulation layer defines an uppermost surface of the fingerprint recognition semiconductor device. The upper surface of the insulation layer has no wiring layer.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3A is a schematic plan view illustrating a method for manufacturing the fingerprint recognition semiconductor device of FIG. 1;

FIGS. 3B, 4A, 4B, 5A, 5B, 6A, 6B, and 7 are schematic cross-sectional views illustrating the method for manufacturing the fingerprint recognition semiconductor device of FIG. 1;

DETAILED DESCRIPTION OF THE EMBODIMENTS

Figure 1:
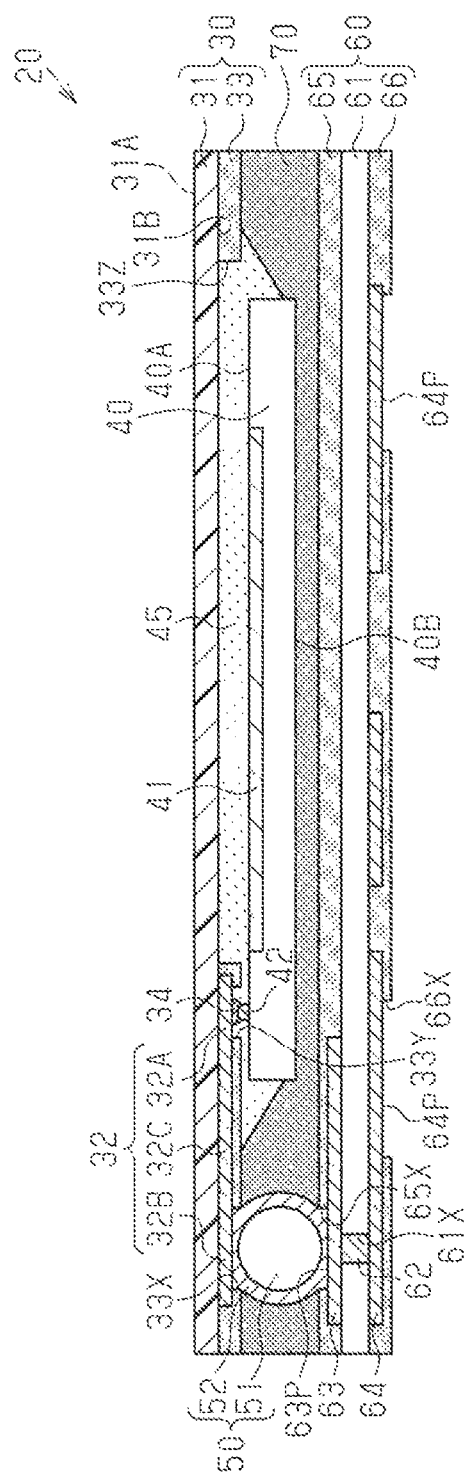
FIG. 1 is a schematic cross-sectional view (cross-sectional view taken along line 1-1 in FIG. 2) illustrating a first embodiment of a fingerprint recognition semiconductor device.

Each embodiment will now be described with reference to the drawings. Elements in the drawings may be partially enlarged and thus have not necessarily been drawn to scale. To facilitate understanding, hatching lines may not be illustrated or be replaced by shadings in the cross-sectional drawings.

First Embodiment

A first embodiment will now be described with reference to FIGS. 1 to 7.

As illustrated in FIG. 1, a fingerprint recognition semiconductor device 20, which is one example of a semiconductor device, functions as a fingerprint sensor. The fingerprint recognition semiconductor device 20 includes a substrate 30, a sensor element 40, a wiring substrate 60, and an encapsulation resin 70. The sensor element 40 is flip-chip-mounted on the substrate 30. The wiring substrate 60 is joined to the substrate 30 with solder balls 50. The encapsulation resin 70 fills a gap between the substrate 30 and the wiring substrate 60. Hereinafter, a region in which the sensor element 40 is mounted on the substrate 30, that is, a region of the substrate 30 that is overlapped with the sensor element 40 in a plan view, is referred to as the mount region of the sensor element 40.

The substrate 30 includes an insulation layer 31, a wiring pattern 32, and a solder resist layer 33.

Figure 2:
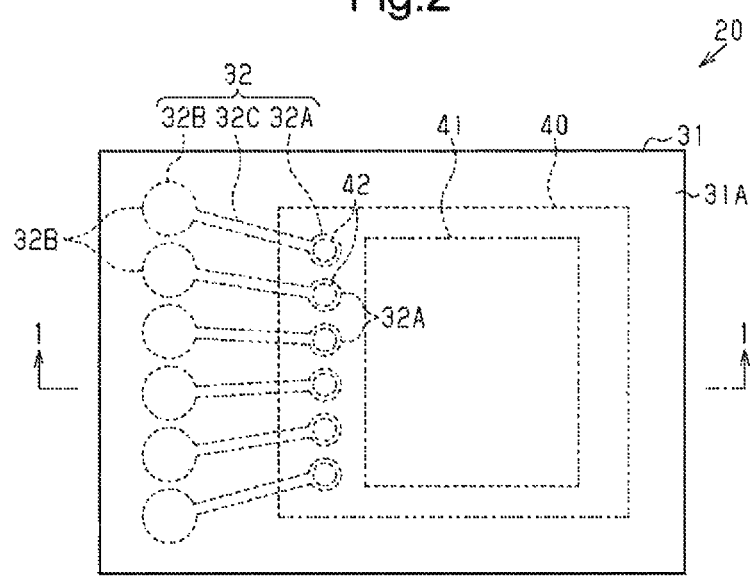
FIG. 2 is a schematic plan view illustrating the fingerprint recognition semiconductor device of FIG. 1.

The insulation layer 31 is the outermost layer of the fingerprint recognition semiconductor device 20. Thus, the insulation layer 31 includes a first surface 31A (in FIG. 1, upper surface), which corresponds to the outermost surface (in FIG. 1, uppermost surface) of the fingerprint recognition semiconductor device 20. The first surface 31A is exposed to the exterior of the fingerprint recognition semiconductor device 20. In this example, as illustrated in FIG. 2, the first surface 31A of the insulation layer 31 is entirely exposed to the exterior of the fingerprint recognition semiconductor device 20. Thus, the first surface 31A of the insulation layer 31 is free from a metal layer such as a wiring pattern. The first surface 31A of the insulation layer 31 is flat. FIG. 2 is a plan view illustrating the fingerprint recognition semiconductor device 20 of FIG. 1 as viewed from above.

The insulation layer 31 has the form of a thin layer (film). To improve the detection sensitivity of the sensor element 40 (sensor sensitivity) and protect the sensor element 40, the insulation layer 31 is set to be as thin as possible within a range in which the desired hardness is obtained. Such a thickness of the insulation layer 31 may be, for example, approximately 15 to 25 μm. The insulation layer 31 may have any planar shape. The insulation layer 31 is, for example, rectangular in a plan view. To physically protect the sensor element 40, it is preferred that a resin material that is superior in hardness and strength be used as the material of the insulation layer 31. Additionally, to electrically protect the sensor element 40, it is preferred that a resin material having a high insulation resistance voltage be used as the material of the insulation layer 31. For example, the hardness of the insulation layer 31 is preferably 4H or greater, and the insulation breakdown voltage of the insulation layer 31 is preferably 4 KV or greater. One example of the material of the insulation layer 31 is a resin material that has a mixture of an epoxy-based resin and a polyimide-based resin and contains filler such as silica ($SiO_2$) or alumina ($Al_2O_3$). Additionally, the material of the insulation layer 31 is not limited to a thermosetting resin material and may be a photosensitive resin material.

As illustrated in FIG. 1, the insulation layer 31 includes the first surface 31A and a second surface 31B (in FIG. 1, lower surface), which is located at a side opposite to the first surface 31A. A plurality of wiring patterns 32 are formed on the second surface 31B of the insulation layer 31. That is, the second surface 31B, on which the wiring patterns 32 are formed, is located at a side of a mount surface, on which the sensor element 40 is mounted. The insulation layer 31 has functions of supporting and fixing the wiring patterns 32 in addition to the function of protecting the sensor element 40.

As illustrated in FIG. 2, each wiring pattern 32 includes a pad 32A, a connection pad 32B, and a lead-out wiring 32C connecting the pad 32A and the connection pad 32B. The pads 32A are arranged in the mount region of the sensor element 40. The connection pads 32B are arranged outside the mount region of the sensor element 40. In other words, in each wiring pattern 32, the pad 32A is connected to one end of the lead-out wiring 32C, and the connection pad 32B is connected to the other end of the lead-out wiring 32C. More specifically, the lead-out wiring 32C extends from the pad 32A in a planar direction (direction orthogonal to the thickness-wise direction of the insulation layer 31 in a cross-sectional view), and the connection pad 32B is formed on a distal end of the lead-out wiring 32C. The pad 32A, the connection pad 32B, and the lead-out wiring 32C are integrally formed. The material of the wiring patterns 32 (pad 32A, connection pad 32B, and lead-out wiring 32C) may be, for example, copper or an alloy of copper. The thickness of each wiring pattern 32 may be, for example, approximately 5 to 20 μm. Each pad 32A, which is a sensor element mounting pad, is connected to the sensor element 40. The pads 32A are arranged in the mount region in correspondence with the layout of a plurality of connection terminals 42, which are arranged in the sensor element 40. For example, the pads 32A and the connection terminals 42 are arranged beside each other along only one side (in FIG. 2, left side) of four sides of the sensor element 40, which is rectangular in a plan view. The pads 32A and the connection terminals 42 are located at an outer side of a sensor portion 41 and at an inner side of the peripheral edge of the sensor element 40. Each pad 32A is, for example, circular in a plan view. The planar shape of each pad 32A is not limited to a circle and may be rectangular or another known form.

The connection pads 32B are arranged outside the mount region of the sensor element 40. For example, the connection pads 32B are arranged along only one side (in FIG. 2, left side) of four sides of the insulation layer 31, which is rectangular in a plan view. Each connection pad 32B is, for example, circular in a plan view. Additionally, each connection pad 32B has a planar shape that is larger than that of a pad 32A. The planar shape of each connection pad 32B is not limited to a circle and may be rectangular or another known form. Alternatively, the planar shape of each connection pad 32B may be smaller than that of a pad 32A or have the same size as that of a pad 32A. As illustrated in FIG. 1, the connection pads 32B are electrically connected to the wiring substrate 60.

The solder resist layer 33 is formed on the second surface 31B of the insulation layer 31 to partially cover the wiring patterns 32. The solder resist layer 33 includes openings 33X, each partially exposing a portion of the corresponding wiring pattern 32 as one of the connection pads 32B. The solder resist layer 33 also includes openings 33Y, each exposing a different portion of the corresponding wiring pattern 32 as one of the pads 32A. The pads 32A, which are exposed in the openings 33Y, may have a solder mask defined (SMD) structure, a non-solder mask defined (NSMD) structure, or another known structure. Additionally, the solder resist layer 33 includes an opening 33Z where the solder resist layer 33 is overlapped with the mount region of the sensor element 40. The second surface 31B of the insulation layer 31 is exposed in the opening 33Z. Metal layers such as the wiring patterns 32 are not formed on the second surface 31B of the insulation layer 31 that is exposed in the opening 33Z. In FIG. 1, the thickness from the second surface 31B (here, lower surface) of the insulation layer 31 to the lower surface of the solder resist layer 33 may be, for example, approximately 30 to 40 μm. The material of the solder resist layer 33 may be, for example, an insulative resin such as an epoxy-based resin or an acrylic resin.

A connection terminal 34 is formed on each pad 32A. For example, a pre-solder or a surface-processed layer may be used as the connection terminal 34. For example, a eutectic solder or a lead (Pb) free solder (e.g., tin (Sn)-silver (Ag) base, Sn—Cu base, Sn—Ag—Cu base) may be used as the pre-solder. For example, a Sn layer, a gold (Au) layer, a nickel (Ni) layer/Au layer (metal layer of Ni layer and Au layer stacked sequentially), or a Ni layer/palladium (Pd) layer/Au layer (metal layer of Ni layer, Pd layer, and Au layer stacked sequentially) may be used as the surface-processed layer. Additionally, an anti-oxidizing process such as the organic solderability preservative (OSP) process may be performed on the pads 32A to form surface-processed layers (connection terminals 34).

The sensor element 40 is, for example, a semiconductor chip. The sensor element 40 is flip-chip-mounted on the substrate 30. The sensor element 40 includes an active surface 40A (circuit formation surface) and a rear surface 40B, which is located at a side opposite to the active surface 40A. The connection terminals 42 are arranged on the active surface 40A (in FIG. 1, upper surface) of the sensor element 40. When the connection terminals 42 are flip-chip-joined to the pads 32A of the wiring patterns 32, the sensor element 40 is face-down-joined to the substrate 30. In this example, the connection terminals 42 are joined to the connection terminals 34 located on the pads 32A. Thus, the sensor element 40 is electrically connected to the wiring patterns 32 (pads 32A) via the connection terminals 42, 34.

The sensor portion 41, which performs fingerprint recognition, is located on the active surface 40A of the sensor element 40. The sensor portion 41 forms a fingerprint recognition region. The sensor element 40 is, for example, an electrostatic capacitance sensor element, which performs the fingerprint recognition on a finger of a user. The sensor element 40, which detects a fingerprint, is not limited to the electrostatic capacitance type and may be a voltage measurement type or another type. The thickness of the sensor element 40 may be, for example, approximately 80 to 100 μm.

For example, a gold bump or a solder bump may be used as each connection terminal 42. The material of the gold bump may be, for example, an alloy containing Pb, an alloy of Sn and Au, an alloy of Sn and Cu, an alloy of Sn and Ag, and an alloy of Sn, Ag, and Cu. Alternatively, for example, a metal post, which is a rod-like connection terminal, may be used as each connection terminal 42. The material of the metal post may be, for example, copper or an alloy of Cu.

In FIG. 1, the gap between the lower surfaces of the wiring patterns 32 and the active surface 40A of the sensor element 40 may be, for example, approximately 20 to 35 μm. The thickness from the active surface 40A of the sensor element 40 to the first surface 31A of the insulation layer 31 may be, for example, approximately 40 to 60 μm. That is, the distance from the first surface 31A of the insulation layer 31, on which the user places his or her finger, to the sensor portion 41 of the sensor element 40 may be set to be short, or approximately 40 to 60 μm.

As illustrated in FIG. 1, a gap between the lower surface of the substrate 30 (e.g., second surface 31B of insulation layer 31) and the active surface 40A of the sensor element 40 is filled with an underfill 45. To physically protect the sensor element 40, it is preferred that a resin material that is superior in hardness and strength be used as the underfill 45. Also, to electrically protect the sensor element 40, it is preferred that a resin material having a high insulation resistance voltage be used as the underfill 45. Such a material of the underfill 45 may be, for example, an insulative resin such as an epoxy-based resin or an acrylic resin.

In the fingerprint recognition semiconductor device 20 of this example, the active surface 40A of the sensor element 40 is entirely covered by the insulation layer 31 and the underfill 45. This limits physical and electrical impacts on the active surface 40A of the sensor element 40. For example, damage such as scratches is limited in the active surface 40A (sensor portion 41), and the sensor portion 41 is protected from moisture and stress.

The structure of the wiring substrate 60 will now be described.

The wiring substrate 60 includes a core substrate 61, through electrodes 62, an uppermost wiring layer 63, a lowermost wiring layer 64, and solder resist layers 65, 66. Each through electrode 62 is formed in a through hole 61X, which extends through the core substrate 61 in the thickness-wise direction. The uppermost wiring layer 63 is formed on a first surface (in FIG. 1, upper surface) of the core substrate 61. The lowermost wiring layer 64 is formed on a second surface (in FIG. 1, lower surface) of the core substrate 61. The wiring layers 63, 64 are electrically connected to each other by the through electrodes 62.

The solder resist layer 65 is stacked on the first surface of the core substrate 61 to partially cover the wiring layer 63. The solder resist layer 65 includes a plurality of openings 65X, exposing portions of the wiring layer 63 as a plurality of connection pads 63P. The connection pads 63P respectively face the connection pads 32B of the substrate 30 and electrically connected to the connection pads 32B.

The solder resist layer 66 is stacked on the second surface of the core substrate 61 to partially cover the wiring layer 64. The solder resist layer 66 includes a plurality of openings 66X, exposing portions of the wiring layer 64 as a plurality of external connection pads 64P. The external connection pads 64P are connected to external connection terminals such as solder balls or lead pins, which are used when the fingerprint recognition semiconductor device 20 is mounted on a mount substrate such as a motherboard. If necessary, a surface-processed layer may be formed on the wiring layer 64, which is exposed in the openings 66X. The surface-processed layer is, for example, an Au layer, a Ni layer/Au layer, or a Ni layer/Pd layer/Au layer. Additionally, an anti-oxidizing process such as the OSP process may be performed on the external connection pads 64P to form surface-processed layers. Here, the wiring layer 64, which is exposed in the openings 66X, may be used as external connection terminals. Alternatively, when surface-processed layers are formed on the wiring layer 64, the surface-processed layers may be used as external connection terminals. More specifically, the wiring substrate 60 may be a ball grid array (BGA) type, a pin grid array (PGA) type, or a land grid array (LGA) type.

For example, a glass epoxy resin may be used as the material of the core substrate 61. For example, the glass epoxy resin is formed by impregnating a glass cloth, which is a reinforcement material, with a thermosetting insulation resin, the main component of which is an epoxy resin, and curing the insulation resin. The material of the through electrodes 62 and the wiring layers 63, 64 may be, for example, copper or an alloy of copper. The material of the solder resist layers 65, 66 may be, for example, an insulative resin such as an epoxy-based resin or an acrylic resin.

It is sufficient for the wiring substrate 60 to have a structure in which at least the wiring layers 63, 64 are electrically connected to each other by the wiring substrate 60. Thus, the internal structure of the wiring substrate 60 between the wiring layers 63, 64 is not particularly limited. For example, the structure and material of the core substrate 61 is not particularly limited. Further, the desired number of inner wiring layers and insulation layers, which cover the inner wiring layers, may be formed on each of the upper surface and the lower surface of the core substrate 61. Alternatively, the wiring substrate 60 may be a coreless substrate, which does not include the core substrate 61. Additionally, although the resin material is used in the wiring substrate 60, a silicon wiring substrate or a ceramic wiring substrate may be used as the wiring substrate 60.

The wiring substrate 60 is arranged to face the rear surface 40B (in FIG. 1, lower surface) of the sensor element 40 that is located at a side opposite to the active surface 40A of the sensor element 40. In the example of FIG. 1, the wiring substrate 60 is arranged so that the upper surface of the wiring layer 63, which is stacked on the upper surface of the core substrate 61, faces the lower surfaces of the wiring patterns 32 of the substrate 30. The wiring substrate 60 is stacked on and joined to the substrate 30 with the solder balls 50.

The solder balls 50 are joined to the connection pads 63P of the wiring substrate 60. Also, the solder balls 50 are jointed to the connection pads 32B of the substrate 30. More specifically, the solder balls 50 are located between the substrate 30 and the wiring substrate 60 and joined to the connection pads 63P and the connection pads 32B. The solder balls 50 function as connection terminals, which electrically connect the connection pads 63P to the connection pads 32B, and also as spacers, which maintain a separation distance between the substrate 30 and the wiring substrate 60 at a set value.

In this example, each solder ball 50 includes a spherical copper core ball 51 and a solder 52 covering the periphery of the copper core ball 51. In the solder ball 50, the solder 52 functions as a joining member. Thus, the solder ball 50 is joined to the connection pads 32B, 63P by the solder 52. Additionally, the copper core ball 51 of the solder ball 50 functions as a spacer.

In this manner, the solder balls 50 electrically connect the wiring patterns 32 and the wiring layer 63. Consequently, electrode pads (not illustrated), which are formed on the active surface 40A of the sensor element 40, are electrically connected to the wiring layer 64 via the connection terminals 42, which are located on the electrode pads, the connection terminals 34, the wiring patterns 32, the solder balls 50, the wiring layer 63, and the through electrodes 62. More specifically, the electrode pads of the sensor element 40 are electrically connected to the pads 32A of the wiring patterns 32 via the connection terminals 42, 34. Each pad 32A is connected to the corresponding connection pad 32B, which is located on the distal end of the lead-out wiring 32C extending in the planar direction. The connection pad 32B is electrically connected to the wiring layer 63 by the corresponding solder ball 50. The wiring layer 63 is electrically connected to the wiring layer 64 by the through electrodes 62. Consequently, the electrode pads of the sensor element 40 are electrically connected to the external connection pads 64P, which are exposed in the lower surface of the wiring substrate 60 that faces the rear surface 40B of the sensor element 40.

In FIG. 1, the gap between the second surface 31B (here, lower surface) of the insulation layer 31 and the upper surface of the wiring substrate 60 is filled with the encapsulation resin 70, which encapsulates the sensor element 40, the solder balls 50, and the like. The encapsulation resin 70 fixes the wiring substrate 60 to the substrate 30 and encapsulates the sensor element 40. More specifically, the encapsulation resin 70 functions as an adhesive agent, which adheres the substrate 30 and the wiring substrate 60, and also as a protection layer, which protects the sensor element 40. The encapsulation resin 70 improves the connection strength of portions connecting the connection pads 32B, 63P and the solder balls 50. This improves the connection reliability of the connection pads 32B, 63P and the solder balls 50. Additionally, the encapsulation resin 70 increases the mechanical strength of the entire fingerprint recognition semiconductor device 20. This maintains a high level of the flatness for the fingerprint recognition semiconductor device 20.

The material of the encapsulation resin 70 may be, for example, an insulative resin such as an epoxy-based resin or a polyimide-based resin. Also, the material of the encapsulation resin 70 may be, for example, a resin in which filler such as silica is mixed into an epoxy-based resin or a polyimide-based resin. The filler may be, for example, a known inorganic compound such as silica or an organic compound. The encapsulation resin 70 may be, for example, a mold resin that is formed by a transfer molding process, a compression molding process, an injection molding process, or the like.

In this manner, when the substrate 30 and the wiring substrate 60 are stacked and joined with the solder balls 50, the fingerprint recognition semiconductor device 20 has a package on package (POP) structure. Additionally, the fingerprint recognition semiconductor device 20 has a structure in which the sensor element 40 is incorporated in a gap between the substrate 30 and the wiring substrate 60.

A method for manufacturing the fingerprint recognition semiconductor device 20 will now be described. For the sake of brevity, portions that ultimately become elements of the fingerprint recognition semiconductor device 20 are indicated by reference characters used to denote the final element.

As illustrated in FIG. 3A, a batch-processing support substrate 80 is prepared. The support substrate 80 includes a plurality of discrete regions C1 arranged in a matrix (here, 2×2). Each discrete region C1 includes a structural body that corresponds to the fingerprint recognition semiconductor device 20. For example, a metal plate or a metal foil may be used as the support substrate 80. Also, a tape-like substrate may be used as the support substrate 80. The tape-like substrate is, for example, a glass plate or a resin film such as a polyimide (PI) film or a polyphenylenesulfide (PPS) film. In the present embodiment, a copper plate is used as the support substrate 80. The support substrate 80 includes a flat first surface 80A (in FIG. 3B, upper surface). The thickness of the support substrate 80 is, for example, approximately 0.3 to 1.0 mm. In this manufacturing method, the structural body, which corresponds to the fingerprint recognition semiconductor device 20, is formed in each discrete region C1. After the support substrate 80 is removed, the discrete regions C1 are cut along cutting lines D1 with a dicing blade or the like to separate individual fingerprint recognition semiconductor devices 20. In FIGS. 3B to 7, the structural body in a single discrete region C1 is enlarged for the sake of brevity.

In the step illustrated in FIG. 3B, a structural body that corresponds to the substrate 30 is formed on the first surface 80A of the support substrate 80 in each discrete region C1. One example of a method for manufacturing the structural body, which corresponds to the substrate 30, will now be described.

The insulation layer 31 is formed to entirely cover the first surface 80A of the support substrate 80. Then, a copper foil is formed to entirely cover the second surface 31B (in FIG. 3B, upper surface) of the insulation layer 31. For example, a single-surface copper applied substrate, in which one surface (here, second surface 31B) of the insulation layer 31 is coated by a copper foil, is prepared, and the other side (here, first surface 31A) of the insulation layer 31 is adhered to the first surface 80A of the support substrate 80. Consequently, the insulation layer 31 and the copper foil are sequentially stacked on the first surface 80A of the support substrate 80. The first surface 80A of the support substrate 80 is flat. Thus, the first surface 31A (in FIG. 3B, lower surface) of the insulation layer 31, which is in contact with the first surface 80A of the support substrate 80, is flatly formed along the first surface 80A (flat surface) of the support substrate 80. Subsequently, the copper foil is patterned into a desired shape using a subtractive process or the like. This forms the wiring patterns 32 including the pads 32A, the connection pads 32B, and the lead-out wirings 32C. Then, the solder resist layer 33, which includes the openings 33X, 33Y, 33Z, is formed on the second surface 31B of the insulation layer 31. Through the above step, the structural body, which corresponds to the substrate 30, is manufactured in each discrete region C1.

In the step illustrated in FIG. 4A, the connection terminals 34 are formed on the pads 32A. When the connection terminals 34 are each a pre-solder, for example, a solder paste may be applied to the pads 32A and undergo a reflow process to form the connection terminals 34. Additionally, when the connection terminals 34 are each a surface-processed layer (e.g., Sn layer), the connection terminals 34 may be formed through an electroless plating process. The formation of the connection terminals 34 may be omitted depending on the design of the connection terminals 42 of the sensor element 40.

The B-stage (semi-cured) underfill 45 is formed on the second surface 31B of the insulation layer 31 that corresponds to the mount region of the sensor element 40 so that the underfill 45 covers the connection terminals 34 and the wiring patterns 32, which are exposed from the solder resist layer 33. When a film of insulation resin is used as the material of the underfill 45, the second surface 31B of the insulation layer 31 is laminated with the film of insulation resin. In this step, the film of insulation resin is not cured. Thus, the insulation resin remains in the B-stage state. The lamination with the underfill 45 in a vacuum atmosphere limits the formation of voids in the underfill 45. When an insulation resin in liquid or paste form is used as the material of the underfill 45, the insulation resin in liquid or paste form is applied to the second surface 31B of the insulation layer 31, for example, through a printing process or a dispensing process.

In the step illustrated in FIG. 4A, the sensor element 40, in which the sensor portion 41 and the connection terminals 42 are formed on the active surface 40A, is located above the substrate 30. More specifically, when the active surface 40A of the sensor element 40 faces the second surface 31B of the insulation layer 31, the connection terminals 42 of the sensor element 40 are positioned relative to the connection terminals 34 of the pads 32A.

In the step illustrated in FIG. 4B, the connection terminals 42 of the sensor element 40 are flip-chip-joined to the pads 32A of the wiring patterns 32. For example, when the sensor element 40 is mounted on the substrate 30 with the underfill 45 located in between, the sensor element 40 is temporarily fixed to the substrate 30 using the adhesiveness of the B-stage underfill 45. Then, a load is applied to the sensor element 40 from the rear surface 40B under a temperature of, for example, approximately 190° C. to 300° C. Consequently, the connection terminals 42 of the sensor element 40 extend through the semi-cured underfill 45 and contact the connection terminals 34 arranged on the pads 32A. Thus, the connection terminals 42, 34 are electrically connected. In this case, when a solder is used for at least one of the connection terminals 34 and the connection terminals 42, the solder is melted and solidified to connect the connection terminals 34, 42 to each other. The underfill 45 is thermally cured through a heating process. As a result, the pads 32A, the connection terminals 34, 42, the sensor portion 41, and the like are covered by the thermally cured underfill 45.

In this manner, after the semi-cured film of the underfill 45 is formed on the substrate 30 (insulation layer 31) and the sensor element 40 is flip-chip-mounted on the substrate 30, the underfill 45 is thermally cured. Thus, when the sensor element 40 is pressed toward the substrate 30, the semi-cured underfill 45 is arranged between the substrate 30 and the sensor element 40. Thus, even when the connection terminals 42 are arranged at one side of the sensor element 40, situations in which, when mounted, the sensor element 40 is inclined relative to the first surface 31A of the insulation layer 31 are limited. This appropriately maintains the flatness of the sensor element 40 subsequent to the flip-chip mounting. More specifically, the sensor element 40 may be mounted on the substrate 30 so that the active surface 40A (sensor portion 41) of the sensor element 40 is generally parallel to the first surface 31A of the insulation layer 31.

In the step illustrated in FIG. 5A, the wiring substrate 60 is prepared. The wiring substrate 60 may be manufactured through a known manufacturing method. Such a manufacturing method will now be briefly described with reference to FIG. 5A.

A plurality of through holes 61X extend through predetermined portions of the core substrate 61. The through holes 61X are filled with the through electrodes 62. Subsequently, the wiring layers 63, 64 are formed on two opposite surfaces of the core substrate 61, for example, using a subtractive process. Then, the solder resist layer 65 including the openings 65X is formed. Each opening 65X exposes a portion of the wiring layer 63 and defines a connection pad 63P with the exposed portion. In the same manner, the solder resist layer 66 including the openings 66X is formed. Each opening 66X exposes a portion of the wiring layer 64 and defines an external connection pad 64P with the exposed portion. Through the step, the wiring substrate 60 may be manufactured.

The solder balls 50 are mounted on (joined to) the connection pads 63P. For example, after a flux is appropriately applied to the connection pads 63P, the solder balls 50 are mounted on the connection pads 63P and undergo a reflow process at a temperature of approximately 230° C. to 260° C. This fixes the solder balls 50 to the connection pads 63P. Subsequently, an unnecessary flux is removed by surface cleaning.

In the step illustrated in FIG. 5A, the wiring substrate 60 including the solder balls 50 is placed above the substrate 30, that is, at a location where the wiring substrate 60 faces the rear surface 40B of the sensor element 40. The wiring substrate 60 is positioned when the solder balls 50 (connection pads 63P) face the connection pads 32B.

In the step illustrated in FIG. 5B, the solder balls 50 are joined to the connection pads 32B. For example, a flux is appropriately applied to the connection pads 32B. The wiring substrate 60 is located on the substrate 30 with the solder balls 50 located in between, and the wiring substrate 60 and the substrate 30 undergo thermocompression bonding at a temperature of 230° C. to 260° C. This melts the solder 52 of each solder ball 50 and joins the solder ball 50 to the corresponding connection pad 32B. As a result, the connection pads 32B and the connection pads 63P are electrically connected by the solder balls 50, and the wiring substrate 60 is fixed to the substrate 30 by the solder balls 50.

In the step illustrated in FIG. 6A, the encapsulation resin 70 fills a gap between the substrate 30 and the wiring substrate 60, more specifically, a gap between the solder resist layer 33 and the solder resist layer 65. The filling of the encapsulation resin 70 firmly fixes the substrate 30 to the wiring substrate 60. Also, the sensor element 40 is encapsulated by the encapsulation resin 70. For example, when a thermosetting mold resin is used as the material of the encapsulation resin 70, the structural body, which is illustrated in FIG. 5B, is accommodated in a mold. Then, a fluid mold resin is drawn into the mold, and pressure (e.g., 5 to 10 MPa) is applied to the mold. Subsequently, the mold resin is heated and cured at a temperature of approximately 180° C. to form the encapsulation resin 70. The process for filling with a mold resin is, for example, a transfer molding process, a compression molding process, or an injection molding process.

Through the above manufacturing steps, the structural body corresponding to the fingerprint recognition semiconductor device 20 is manufactured in each discrete region C1.

In the step illustrated in FIG. 6B, the support substrate 80 (refer to FIG. 6A), which is used as a temporary substrate, is removed. For example, when a copper foil is used as the support substrate 80, the support substrate 80 is removed by wet etching using an iron (III) chloride solution, a copper (II) chloride solution, an ammonium persulfate, or the like. In this case, the insulation layer 31 functions as an etching stopper layer. Thus, only the support substrate 80, which is a copper plate, may be selectively etched. However, when the outermost layers of the external connection pads 64P are copper, the external connection pads 64P need to be masked when performing the wet etching. This prevents the etching of the external connection pads 64P when etching the support substrate 80. When a PI film (polyimide film) or the like is used as the support substrate 80 or when the support substrate 80 includes a separation layer, the support substrate 80 may be mechanically separated from the insulation layer 31. When the support substrate 80 is removed, the first surface 31A of the insulation layer 31 is exposed. FIG. 6B illustrates the structural body of FIG. 6A that is reversed upside down.

The support substrate 80 is relatively thick to ensure the mechanical strength of the structural body of the fingerprint recognition semiconductor device 20 during the manufacturing. The support substrate 80 is removed from the fingerprint recognition semiconductor device 20 after the manufacturing. Thus, each component of the fingerprint recognition semiconductor device 20 does not have to be thick. This decreases the thickness of the fingerprint recognition semiconductor device 20. Additionally, the encapsulation resin 70 is formed before the support substrate 80 is removed. Thus, the encapsulation resin 70 sufficiently ensures the mechanical strength of the structural body, which is illustrated in FIG. 6A. Further, even when the support substrate 80 is removed, the ease of handling of the fingerprint recognition semiconductor device 20 is not affected during transportation.

Figure 7:
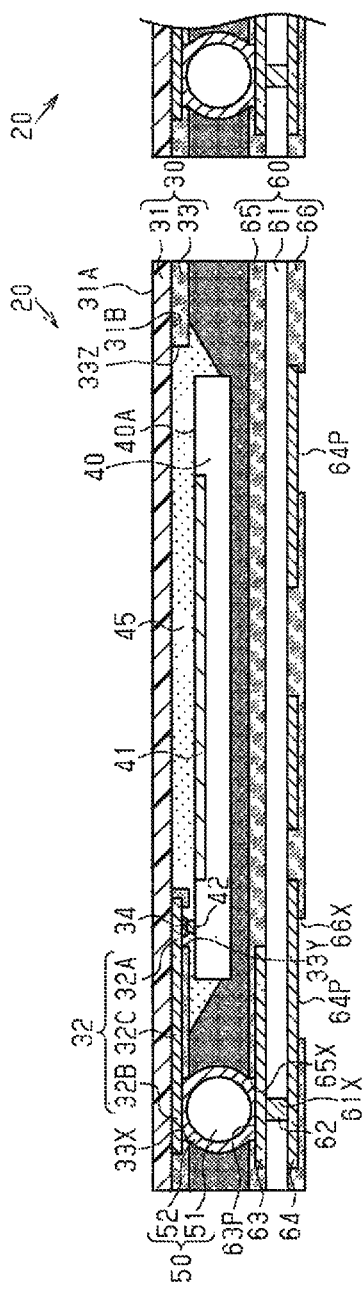
Figure 8:
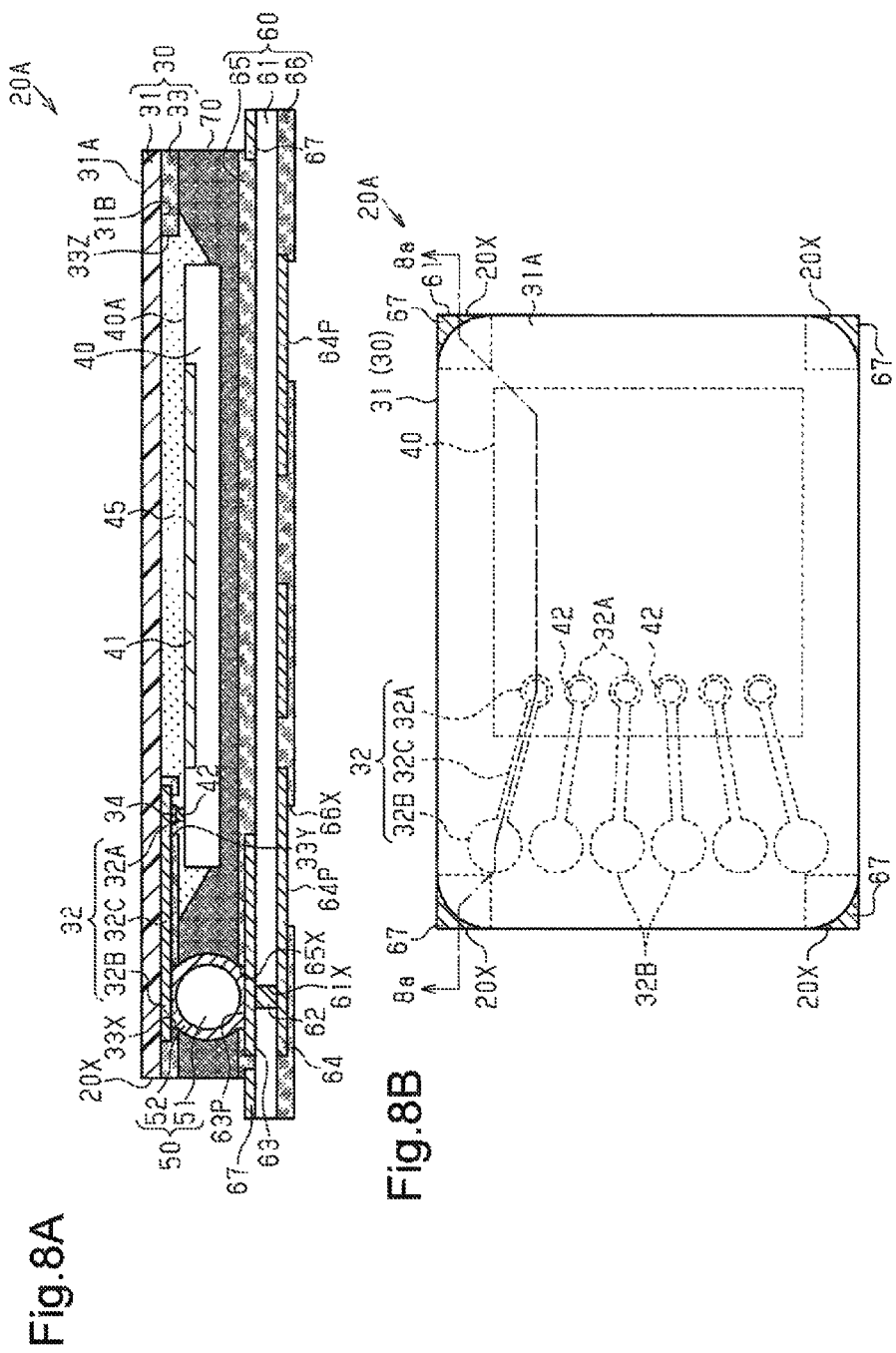
FIG. 8A is a schematic cross-sectional view (cross-sectional view taken along line 8a-8a in FIG. 8B) illustrating a second embodiment of the fingerprint recognition semiconductor device.
FIG. 8B is a schematic plan view illustrating the fingerprint recognition semiconductor device of FIG. 8A.
Figure 9:
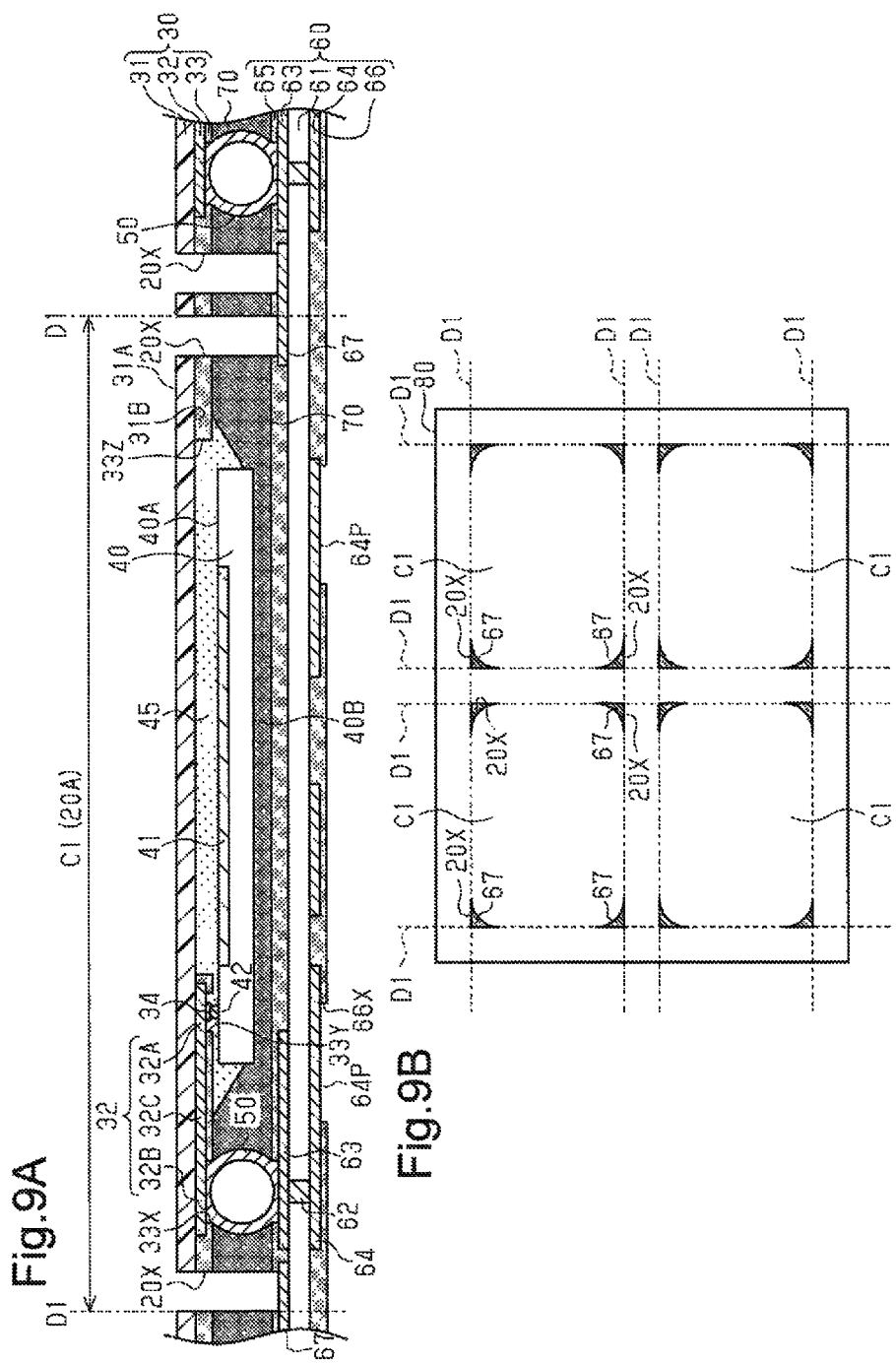
FIG. 9A is a schematic cross-sectional view illustrating a method for manufacturing the fingerprint recognition semiconductor device of FIG. 8A.
FIG. 9B is a schematic plan view illustrating the method for manufacturing the fingerprint recognition semiconductor device of FIG. 8A.

Then, the structural body, which is illustrated in FIG. 6B, is cut by a dicing blade or the like along the cutting lines D1. Consequently, as illustrated in FIG. 7, a plurality of fingerprint recognition semiconductor devices 20 are formed. When a product of the fingerprint recognition semiconductor device 20 has a BGA structure, a known BGA assembling step is performed subsequent to the step illustrated in FIG. 6B. The known BGA assembling step includes, for example, the mounting of solder balls on the external connection pads 64P, reflow, and cleaning.

The first embodiment has the advantages described below.

(1) The wiring patterns 32 are formed on the second surface 31B of the insulation layer 31. The sensor element 40 is flip-chip-connected to the wiring patterns 32. The active surface 40A of the sensor element 40, on which the sensor portion 41 is formed, is entirely covered by the insulation layer 31. Thus, the active surface 40A and the sensor portion 41 of the sensor element 40 are physically and electrically protected by the insulation layer 31.

(2) The sensor element 40 is flip-chip-connected to the wiring patterns 32, which are formed on the second surface 31B of the insulation layer 31. This decreases the thickness from the sensor portion 41 to the first surface 31A (exposed uppermost surface) of the insulation layer 31 as compared to, for example, the second conventional example, in which, in addition to the fingerprint recognition region of the sensor element, the bonding wires are covered and encapsulated by the encapsulation resin. This improves the detection sensitivity of the sensor element 40.

(3) In the second conventional example, manufacturing errors in the sensor element and the substrate, on which the sensor element is mounted, cause variations in the thickness of the encapsulation resin, which encapsulates the sensor element and the bonding wires. Increases in variations in the thickness of the encapsulation resin, which is formed on the fingerprint detection region of the sensor element, cause variations in the properties of the sensor element such as the detection sensitivity.

In this regard, in the fingerprint recognition semiconductor device 20 of the first embodiment, the sensor element 40 is flip-chip-connected to the wiring patterns 32, which are formed on the second surface 31B of the insulation layer 31. The insulation layer 31 covers the sensor portion 41 of the sensor element 40. This decreases variations in the thickness from the sensor portion 41 to the first surface 31A of the insulation layer 31 compared to the second conventional example. Thus, variations in the properties of the sensor element 40 are limited, and the desired properties are stably obtained.

(4) The gap between the second surface 31B of the insulation layer 31 and the active surface 40A of the sensor element 40 is filled with the underfill 45, which entirely covers the active surface 40A of the sensor element 40. The active surface 40A and the sensor portion 41 of the sensor element 40 are physically and electrically protected by the underfill 45.

(5) To electrically connect the sensor element 40 to the external connection pads 64P, which are formed on the wiring substrate 60 that faces the rear surface 40B of the sensor element 40, the wiring patterns 32, which are electrically connected to the sensor element 40, are connected to the wiring substrate 60 by the solder balls 50. This limits increases in the manufacturing cost compared to, for example, when the sensor element 40 is electrically connected to the external connection pads 64P, which are formed on the wiring substrate 60 that faces the rear surface 40B of the sensor element 40, by through electrodes extending through the sensor element 40.

(6) The encapsulation resin 70 fills the gap between the second surface 31B (in FIG. 1, lower surface) of the insulation layer 31 and the upper surface of the wiring substrate 60 and encapsulates the sensor element 40 and the solder balls 50. The encapsulation resin 70 improves the connection strength of the portions connecting the connection pads 32B, 63P and the solder balls 50. Thus, the connection reliability of the connection pads 32B, 63P and the solder balls 50 is improved. Additionally, the encapsulation resin 70 increases the mechanical strength of the entire fingerprint recognition semiconductor device 20. Thus, the flatness of the fingerprint recognition semiconductor device 20 is maintained at a high level.

(7) In the method for manufacturing the fingerprint recognition semiconductor device 20, the semi-cured film of the underfill 45 is formed on the insulation layer 31. After the sensor element 40 is flip-chip-mounted on the insulation layer 31, the underfill 45 is thermally cured. Thus, even when the connection terminals 42 are arranged at one side of the sensor element 40, situations in which, when mounted, the sensor element 40 is inclined relative to the first surface 31A of the insulation layer 31 are limited. This appropriately maintains the flatness of the sensor element 40 subsequent to the flip-chip mounting. Additionally, when the sensor element 40 is flip-chip-mounted, the semi-cured underfill 45 is deformed and covers the connection terminals 34, 42 and the pads 32A. Thus, even when a gap between the insulation layer 31 and the sensor element 40 is narrow, the gap is appropriately filled with the underfill 45. In other words, even when the underfill 45 is formed, the gap between the insulation layer 31 and the sensor element 40 may be narrowed. As a result, the thickness from the sensor portion 41 to the first surface 31A of the insulation layer 31 may be decreased while protecting the sensor element 40 by the underfill 45.

Second Embodiment

A second embodiment will now be described with reference to FIGS. 8A to 10. The same reference characters are given to those components that are the same as the corresponding components illustrated in FIGS. 1 to 7. Such components will not be described in detail. The second embodiment will be described focusing on the differences from the first embodiment.

As illustrated in FIG. 8A, in addition to the wiring layer 63, metal layers 67 are formed on the upper surface of the core substrate 61 of the wiring substrate 60. For example, the metal layers 67 are located separately from the wiring layer 63. That is, the metal layers 67 are electrically insulated from the wiring layer 63. In other words, the metal layers 67 are dummy patterns, which are floating, or electrically isolated from other metal layers such as wiring layers.

As illustrated in FIG. 8B, the metal layers 67 are formed in four corners of the upper surface of the core substrate 61. The metal layers 67 each have, for example, a solid form. In this example, each metal layer 67 is rectangular in a plan view.

In the second embodiment, the four corners of a fingerprint recognition semiconductor device 20A each include a cutaway portion 20X, which partially exposes the upper surface of the metal layer 67. Each cutaway portion 20X may have any planar shape. For example, each cutaway portion 20X is triangular in a plan view. In this example, each cutaway portion 20X is triangular and has one arcuate side. When the cutaway portions 20X are formed, four corners of the insulation layer 31 (substrate 30), which is rectangular in a plan view, are each rounded into the form of an arc having a predetermined diameter. That is, the four corners of the insulation layer 31 are rounded. In this manner, in the fingerprint recognition semiconductor device 20A, the corners of the insulation layer 31 and the encapsulation resin 70 are rounded to form the cutaway portions 20X.

As illustrated in FIG. 8A, an outer surface of each of the substrate 30 (insulation layer 31 and solder resist layer 33), the encapsulation resin 70, and the solder resist layer 65 partially recedes from an outer surface of the core substrate 61 to form a cutaway portion 20X. Each cutaway portion 20X forms a step including the first surface 31A of the insulation layer 31, the outer surfaces of the substrate 30, the encapsulation resin 70, and the solder resist layer 65, a first surface of the metal layer 67, and an outer surface of the wiring substrate 60.

A method for manufacturing the fingerprint recognition semiconductor device 20A will now be described. The steps up to the one that removes the support substrate 80 (refer to FIG. 6B) are the same as those of the first embodiment and will not be described here.

In the step illustrated in FIG. 9A, after the support substrate 80 (refer to FIG. 6A) is removed, cutaway portions 20X are formed in the structural body, which is formed in each discrete region C1 and corresponds to the fingerprint recognition semiconductor device 20A. More specifically, as illustrated in FIG. 9B, the substrate 30 (insulation layer 31 and solder resist layer 33), the encapsulation resin 70, and the solder resist layer 65 are partially removed in four corners of each discrete region C1, which is rectangular in a plan view, to form the cutaway portions 20X in the four corners of the discrete region C1. When the cutaway portions 20X are formed, the metal layers 67, which are located in the four corners of each discrete region C1, are exposed. The cutaway portions 20X may be formed, for example, by laser cutting such as a YAG laser or a fiber laser. In this step, the metal layers 67 (dummy patterns) are located in positions in which the cutaway portions 20X are formed, that is, positions that are irradiated with a laser beam. This reduces damage to the wiring substrate 60 (e.g., core substrate 61) caused by the laser beam. Additionally, the metal layers 67 stably form the cutaway portions 20X in desired shapes.

Figure 10:
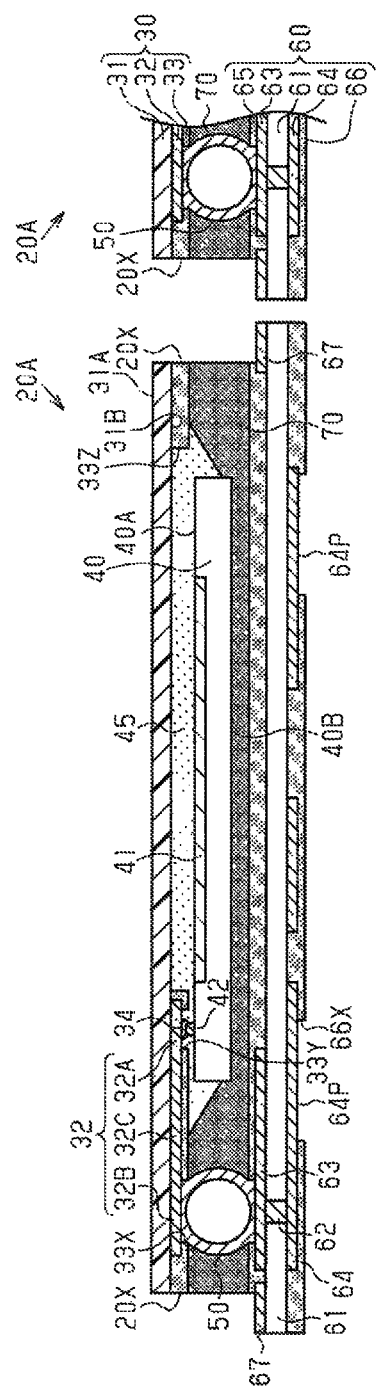
FIG. 10 is a schematic cross-sectional view illustrating the method for manufacturing the fingerprint recognition semiconductor device of FIG. 8A.

Then, the structural body, which is illustrated in FIGS. 9A and 9B, is cut by a dicing blade or the like along the cutting lines D1. Consequently, as illustrated in FIG. 10, a plurality of fingerprint recognition semiconductor devices 20A are formed. This forms the steps including the first surface 31A of the insulation layer 31, the outer surfaces of the substrate 30, the encapsulation resin 70, and the solder resist layer 65, the first surface of the metal layer 67, and the outer surface of the wiring substrate 60.

The second embodiment has the advantages described below in addition to advantages (1) to (7) of the first embodiment.

(8) The cutaway portions 20X are formed in a peripheral portion (more specifically, four corners) of the fingerprint recognition semiconductor device 20A. The cutaway portions 20X expose the metal layers 67, which are formed at a side of the upper surface of the wiring substrate 60. Each cutaway portion 20X forms a step including the outer surfaces of the substrate 30, the encapsulation resin 70, and the solder resist layer 65, and the first surface of the metal layer 67. Thus, for example, when a further member, which surrounds the fingerprint recognition semiconductor device 20A, is coupled to the fingerprint recognition semiconductor device 20A, the further member may be mounted on the steps. Since the cutaway portions 20X are only formed in the four corners of the fingerprint recognition semiconductor device 20A, a further member may be easily mounted on the fingerprint recognition semiconductor device 20A.

(9) The metal layers 67 (dummy patterns) are located in positions in which the cutaway portions 20X are formed, that is, positions that are irradiated with a laser beam. This reduces damage to the wiring substrate 60 (e.g., core substrate 61) caused by the laser beam.

Application Example of Fingerprint Recognition Semiconductor Device

Figure 11:
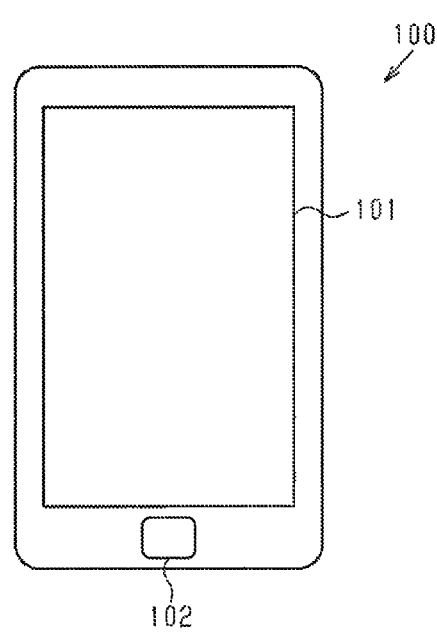
FIG. 11 is a schematic plan view illustrating an example of application of the fingerprint recognition semiconductor device.

As illustrated in FIG. 11, the fingerprint recognition semiconductor devices 20, 20A of the above embodiments are each mounted on a small smart terminal 100 such as a smartphone. For example, the smart terminal 100 includes a touch panel 101 and a sensor 102. The touch panel 101 is a unit that includes a display function and an input function. The sensor 102 is a unit that reads biometric information of a user such as a fingerprint. The fingerprint recognition semiconductor devices 20, 20A are each applicable to the sensor 102.

The fingerprint recognition semiconductor devices 20, 20A may each be mounted on an electronic apparatus other than the smart terminal 100, such as a personal computer.

It should be apparent to those skilled in the art that the present invention may be embodied in many other specific forms without departing from the scope of the invention. Particularly, it should be understood that the present invention may be embodied in the following forms.

In the second embodiment, the planar shape of each cutaway portion 20X is not particularly limited. For example, each cutaway portion 20X may be rectangular in a plan view.

In the second embodiment, the cutaway portions 20X are only formed in the four corners of the fingerprint recognition semiconductor device 20A. Instead, for example, an annular cutaway portion 20X may be formed along the peripheral portion of the fingerprint recognition semiconductor device 20A.

In the second embodiment, the metal layers 67, which are dummy patterns, are exposed from the cutaway portions 20X. Instead, for example, the metal layers 67 may be electrically connected to ground or the like and exposed from the cutaway portions 20X.

In the second embodiment, the metal layers 67 may be omitted from the fingerprint recognition semiconductor device 20A.

In each of the above embodiments, the connection terminals 42 are arranged along only one of the four sides of the sensor element 40. However, the layout of the connection terminals 42 is not particularly limited.

Figure 12:
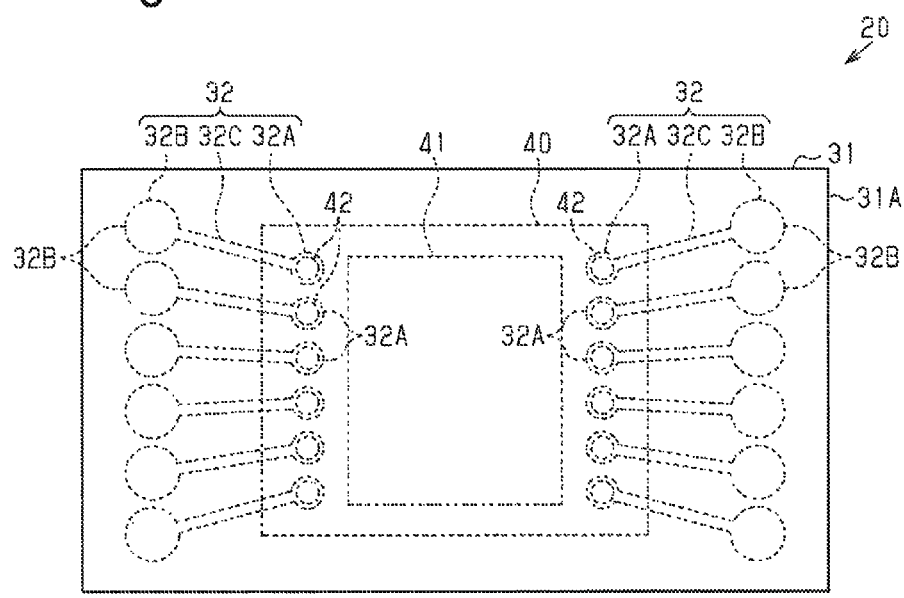
FIG. 12 is a schematic plan view illustrating a modified example of a fingerprint recognition semiconductor device.

For example, as illustrated in FIG. 12, the connection terminals 42 may be arranged along two opposite sides (in FIG. 12, left and right sides) of the four sides of the sensor element 40. In this case, the pads 32A are arranged along the two opposite sides of the sensor element 40 in the same manner.

Alternatively, the connection terminals 42 may be peripherally arranged around the active surface 40A of the sensor element 40. In this case, the pads 32A are peripherally arranged around the sensor element 40 in the same manner.

In each of the above embodiments, the semi-cured underfill 45 is formed on the substrate 30. After the sensor element 40 is flip-chip-mounted on the substrate 30, the underfill 45 is thermally cured. Instead, for example, after the sensor element 40 is flip-chip-mounted on the substrate 30, the gap between the substrate 30 (insulation layer 31) and the sensor element 40 may be filled with the underfill 45 if the flatness of the sensor element 40 is appropriately maintained.

In the above embodiments, the solder resist layers 33, 65, 66 may be omitted from each of the fingerprint recognition semiconductor devices 20, 20A.

In each of the above embodiments, the solder balls 50 are used as connecting members. The solder balls 50 each include a copper core ball 51, which is a conductive core ball. However, a conductive core ball formed by a metal other than copper such as gold or nickel may be used instead of the copper core ball 51. Additionally, a resin core ball formed by a resin may be used instead of the copper core ball 51. Alternatively, a solder ball including no conductive core ball or resin core ball may be used instead of the solder ball 50.

Figure 13:
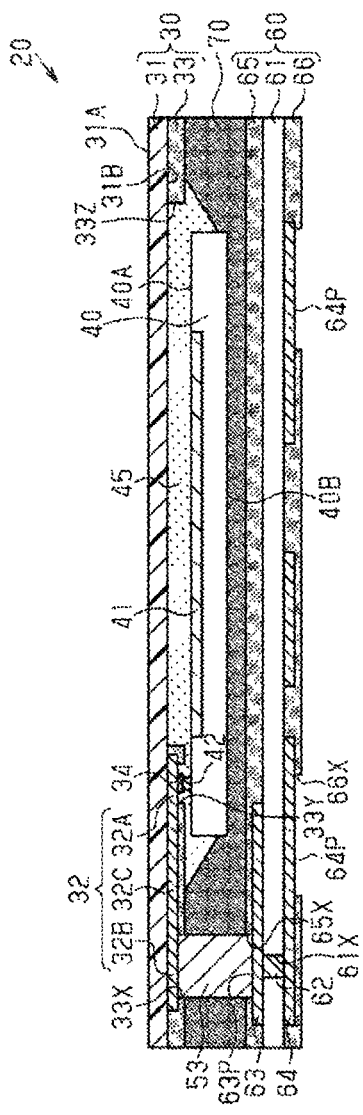
FIG. 13 is a schematic cross-sectional view illustrating another modified example of a fingerprint recognition semiconductor device.

The connecting member, which connects the substrate 30 and the wiring substrate 60, is not limited to the solder ball 50, which is described above. For example, as illustrated in FIG. 13, a rod-like metal post 53 may be used as a connecting member. In this case, one end surface (here, upper end surface) of the metal post 53 is joined to the connection pad 32B, and the other end surface (here, lower end surface) of the metal post 53 is joined to the connection pad 63P. The material of the metal post 53 may be, for example, copper or an alloy of copper.

Alternatively, a rod-like electrode terminal is formed on each of the connection pad 32B and the connection pad 63P, and end surfaces of the two electrode terminals may be directly joined to each other.

In each of the above embodiments and the modified example of FIG. 13, in addition to the connecting member such as the solder ball 50 and the metal post 53, a further spacer may be provided so that the gap between the substrate 30 and the wiring substrate 60 is uniformly formed. The further spacer may be the same as the connecting member or differ from the connecting member.

In the above embodiments and modified examples, the semiconductor devices 20, 20A are each a fingerprint recognition semiconductor device (fingerprint sensor) including the sensor element 40, which performs fingerprint recognition. Instead of fingerprint recognition, the sensor element 40 may read, for example, biometric information of a user such as a finger vein or a palm vein. That is, the semiconductor devices 20, 20A may each be a biometric information recognition semiconductor device (biometric sensor). Alternatively, the sensor element 40 may detect, for example, a contact (touching operation) of a finger of a user, a pen, or the like. That is, the semiconductor devices 20, 20A may each be a touch detection semiconductor device (touch sensor). A semiconductor device such as a biometric sensor or a touch sensor is applicable to, for example, the touch panel 101 illustrated in FIG. 11 or the like.

Clauses

This disclosure further encompasses various embodiments described below.

1. A method for manufacturing a fingerprint recognition semiconductor device, the method including:

forming an insulation layer on a surface of a support substrate;

forming a wiring pattern on a lower surface of the insulation layer;

flip-chip-connecting a sensor element to the wiring pattern, wherein the sensor element includes an active surface, including a sensor portion that recognizes a fingerprint, and a rear surface, located at a side opposite to the active surface;

forming an underfill between the active surface of the sensor element and the lower surface of the insulation layer, wherein the underfill entirely covers the active surface;

connecting a wiring substrate to the wiring pattern by a connecting member, wherein the wiring substrate is arranged to face the rear surface of the sensor element;

forming an encapsulation resin that encapsulates the sensor element, wherein the encapsulation resin fills a gap between an upper surface of the wiring substrate and the lower surface of the insulation layer; and removing the support substrate.

2. The method according to clause 1, wherein the flip-chip-connecting a sensor element to the wiring pattern includes:

forming a first connection terminal on a lower surface of the wiring pattern;

forming an insulation resin on the lower surface of the insulation layer so that the insulation resin covers a mount region where the sensor element is mounted; and flip-chip-connecting the sensor element to the wiring pattern so that a second connection terminal, which is formed on the active surface of the sensor element, is extended through the insulation resin and electrically connected to the first connection terminal, and the forming an underfill includes thermally curing the insulation resin so that the thermally cured insulation resin serves as the underfill.

3. The method according to clause 8, further including:

forming, subsequent to the removal of the support member, a cutaway portion in the insulation layer and the encapsulation resin, wherein the cutaway portion exposes a peripheral portion of the upper surface of the wiring substrate.

The present examples and embodiments are to be considered as illustrative and not restrictive, and the invention is not to be limited to the details given herein, but may be modified within the scope and equivalence of the appended claims.

What is claimed is:

1. A fingerprint recognition semiconductor device comprising:

an insulation layer including an upper surface and a lower surface that is located at a side opposite to the upper surface;

a wiring pattern formed on the lower surface of the insulation layer;

a sensor element flip-chip-connected to the wiring pattern, wherein the sensor element includes an active surface, arranged to face the lower surface of the insulation layer and including a sensor portion that recognizes a fingerprint, and a rear surface, located at a side opposite to the active surface;

an underfill formed between the active surface of the sensor element and the lower surface of the insulation layer;

a wiring substrate arranged to face the rear surface of the sensor element and connected to the wiring pattern by a connecting member; and an encapsulation resin that fills a gap between the lower surface of the insulation layer and an upper surface of the wiring substrate and a gap between the rear surface of the sensor element and the upper surface of the wiring substrate, wherein the active surface of the sensor element is entirely covered by the underfill, the upper surface of the insulation layer defines an uppermost surface of the fingerprint recognition semiconductor device, and the upper surface of the insulation layer has no wiring layer.

2. The fingerprint recognition semiconductor device according to claim 1, further comprising:

a solder resist layer formed on the lower surface of the insulation layer, wherein the solder resist layer includes a first opening, which exposes a portion of the wiring pattern as a connection pad, and a second opening, which is located in a mount region where the sensor element is mounted, and the connecting member is connected to the connection pad.

3. The fingerprint recognition semiconductor device according to claim 1, wherein the lower surface of the insulation layer at a location overlapped with the sensor portion in a plan view is free from the wiring pattern.

4. The fingerprint recognition semiconductor device according to claim 1, wherein the insulation layer and the encapsulation resin includes a cutaway portion that exposes a peripheral portion of the upper surface of the wiring substrate.

5. The fingerprint recognition semiconductor device according to claim 4, wherein the wiring substrate includes:
 a core substrate;
 a first wiring layer formed on an upper surface of the core substrate and connected to the connecting member;
 a metal layer formed on the upper surface of the core substrate; and
 a second wiring layer formed on a lower surface of the core substrate and electrically connected to the first wiring layer, and the metal layer is partially exposed from the cutaway portion.

6. The fingerprint recognition semiconductor device according to claim 1, further comprising:

a plurality of first connection terminals arranged on a lower surface of the wiring pattern; and a plurality of second connection terminals arranged on the active surface along only one side of the sensor element, which is rectangular in a plan view, wherein the second connection terminals are extended through the underfill and connected to the first connection terminals.

7. A semiconductor device comprising:

an insulation layer including an upper surface and a lower surface that is located at a side opposite to the upper surface;

a wiring pattern formed on the lower surface of the insulation layer;

a sensor element flip-chip-connected to the wiring pattern, wherein the sensor element includes an active surface, arranged to face the lower surface of the insulation layer and including a sensor portion that detects a touching operation or recognizes biometric information of a user, and a rear surface, located at a side opposite to the active surface;

an underfill formed between the active surface of the sensor element and the lower surface of the insulation layer;

a wiring substrate arranged to face the rear surface of the sensor element and connected to the wiring pattern by a connecting member; and an encapsulation resin that fills a gap between the lower surface of the insulation layer and an upper surface of the wiring substrate and a gap between the rear surface of the sensor element and the upper surface of the wiring substrate, wherein the active surface of the sensor element is entirely covered by the underfill, the upper surface of the insulation layer defines an uppermost surface of the semiconductor device, and the upper surface of the insulation layer has no wiring layer.

8. The fingerprint recognition semiconductor device according to claim 1, wherein the insulation layer is arranged above and covers the sensor portion of the sensor element.

9. The fingerprint recognition semiconductor device according to claim 1, wherein the underfill is sandwiched between the sensor element and the insulation layer in a region where the sensor portion is formed in the active surface.

10. The semiconductor device according to claim 7, wherein the insulation layer is arranged above and covers the sensor portion of the sensor element.

11. The semiconductor device according to claim 7, wherein the underfill is sandwiched between the sensor element and the insulation layer in a region where the sensor portion is formed in the active surface.

* * * * *